(12) United States Patent
Ouellette et al.

(10) Patent No.: US 7,098,721 B2
(45) Date of Patent: Aug. 29, 2006

(54) LOW VOLTAGE PROGRAMMABLE EFUSE WITH DIFFERENTIAL SENSING SCHEME

(75) Inventors: Michael R. Ouellette, Westford, VT (US); Larry Wissel, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 92 days.

(21) Appl. No.: 10/711,205

(22) Filed: Sep. 1, 2004

(65) Prior Publication Data

US 2006/0044049 A1    Mar. 2, 2006

(51) Int. Cl.
*H01H 37/76* (2006.01)

(52) U.S. Cl. .................................. 327/525

(58) Field of Classification Search ........... 327/525, 327/526

See application file for complete search history.

(56) References Cited

U.S. PATENT DOCUMENTS

| | | | | | |
|---|---|---|---|---|---|
| 4,829,481 | A | * | 5/1989 | Johnson et al. | 365/200 |
| 5,459,423 | A | * | 10/1995 | Nozawa et al. | 327/277 |
| 5,583,463 | A | * | 12/1996 | Merritt | 327/526 |
| 5,907,513 | A | * | 5/1999 | Kato | 365/200 |
| 6,011,428 | A | * | 1/2000 | Tsukude et al. | 327/541 |
| 6,255,894 | B1 | * | 7/2001 | Cutter et al. | 327/525 |
| 6,489,832 | B1 | * | 12/2002 | Kim et al. | 327/525 |
| 6,498,526 | B1 | * | 12/2002 | Lim et al. | 327/525 |
| 6,566,937 | B1 | * | 5/2003 | Mori et al. | 327/525 |
| 6,933,742 | B1 | * | 8/2005 | Wallstab | 326/8 |
| 2004/0046601 | A1 | * | 3/2004 | Jung et al. | 327/525 |
| 2004/0119523 | A1 | * | 6/2004 | Koo | 327/526 |
| 2005/0151578 | A1 | * | 7/2005 | Huang et al. | 327/525 |
| 2005/0212584 | A1 | * | 9/2005 | Parker et al. | 327/525 |
| 2005/0285663 | A1 | * | 12/2005 | Newman | 327/525 |

* cited by examiner

*Primary Examiner*—Jeffrey Zweizig
(74) *Attorney, Agent, or Firm*—Michael J. LeStrange

(57) ABSTRACT

An electronic fuse structure is disclosed for integrated circuits that is programmable with low voltage and incorporates a differential sensing scheme. The programming step is performed at about 1.5 times Vdd while the sense operation is performed at Vdd, which limits the resistance variation through the electronic fuse caused by the sense operation. During the sense operation a gating transistor emulates the voltage drop across a fuse select transistor for the case of an intact fuse. A circuit and method for characterizing the resistance of the electronic fuse is also disclosed.

20 Claims, 3 Drawing Sheets

LOW VOLTAGE PROGRAMMABLE EFUSE WITH DIFFERENTIAL SENSING SCHEME

BACKGROUND OF INVENTION

1. Field of the Invention

The present invention relates to the application of electronically programmable fuses (eFuse) in integrated circuits. An electronically programmable fuse is disclosed with a low voltage programming capability and differential sensing scheme.

2. Background of Invention

With continued scaling in semiconductor technologies to increasingly smaller geometries, on-chip eFuse implementations provide an attractive alternative to conventional fusing schemes for integrated circuits. In terms of area efficiency and performance impact eFuse technology presents a significant improvement over fuse technologies with optical based programming.

Programmable devices for integrated circuits require a dependable methodology for customizing a device in a repeatable and reliable manner. Fusing of programmable connections in microprocessors, FPGAs and other VLSI designs is a common technique to achieve the flexibility of programmability.

The eFuse device fabricated in silicon based integrated circuits is typically programmed using a large voltage, relative to the operating voltage of the integrated circuit, to melt and separate the fuse body material. This process changes the fuse material from a low resistance to a high resistance, which may be measured by "sensing" circuitry to determine whether or not the eFuse has been programmed.

As process technology for integrated circuits has progressed, maximum operating voltages have scaled commensurately downward with physical geometry, making it difficult to provide sufficient voltage to program the eFuse without damaging logic circuitry associated with the fuse bank. In addition, the current density requirements for metal interconnect layers used to supply eFuse programming currents are typically much greater than for signal interconnect lines. As such, fuse programming buses must be implemented with wide metal wires that consume a disproportionate amount of interconnect resources. Furthermore, eFuse devices may require multiple programming pulses to ensure adequate resistance levels for the eFuse device, thereby increasing programming and test time cycles. However, repeated programming may also lead to an unfused condition in the programmed fuse if a sufficiently high voltage is applied. In that instance, the heating associated with re-programming may cause the fuse material to rejoin thereby further degrading fuse related yield.

Common applications for e-Fuse technology include memory array redundancy, package identification coding and post-manufacture programming of logical functions. Since each eFuse is a single primitive device, additional logic and circuitry are necessary to facilitate programming and sensing.

The eFuse programming operation involves sending a large current through the fuse (e.g., 15 mA) for a sufficient time to dramatically change the fuse resistance from an unprogrammed resistance of about 150 $\Omega$ to a resistance of about 50 K$\Omega$. Existing schemes require a high voltage (e.g., 3.3V) to achieve adequate fuse programming current such that all fuses are guaranteed to have a high post-programming resistance. Insufficient programming current may result in a number of fuses exhibiting much lower resistance (e.g., 1 K$\Omega$), and the "yield" following the programming step will be limited by the "tail" of the Gaussian distribution of resulting fuse resistances. In addition, a high programming voltage requires thick-oxide transistors, which, in turn, require extra processing steps to implement. Programming the fuses with a low voltage would eliminate the need for thick-oxide transistors, however, the programming current achievable at low programming voltage limits the maximum post-programming resistance and often requires multiple programming pulses to achieve the desired post fuse programming resistance. In addition, a significant number of low post-programming resistance values can result, which significantly impacts post fuse-programming yield.

Further, the 3.3V supply requires a dedicated package pin and tester channel (for programming at the tester). The routing of the 3.3V signal must be wide, low-resistance metal. This 3.3V supply is on during programming, but off during sensing. Therefore the 3.3V supply must be switchable to support the fuse programming function after final packaging of the integrated circuit in a chip carrier module.

A "sense" circuit is required to discriminate between pre-programming and post-programming resistance, and to provide digital "0" or "1" outputs respectively. Single-ended sensing schemes are known, but they are limited to the minimum resistance they can sense. Consequently, these circuits are not viable if any fuse has a low post-programming resistance. The single-ended scheme also requires an analog current-source-control voltage to be generated and routed to each individual sense circuit. Finally, this technique exhibits very poor noise rejection properties for sensing in the field and high switching activity causes additional noise on the power supply distribution network of the integrated circuit.

For example, FIG. 1 depicts a prior art single-ended eFuse sense scheme. A reference circuit VrefGen 10 creates a voltage VRef to control individual sense-current transistors mPi, with one for each of many fuses Fi. The input of inverter I0 is shorted to the output, establishing a voltage Vm equal to the "trip point" of a latch that would be made of two inverters identical to I0 feeding each other; OpAmp A drives an inverting stage consisting of mPRef and RRef such that Vp has the same voltage as Vm. The OpAmp output voltage VRef then feeds sense-current transistors mPi (one for each fuse Fi), and each fuse presents voltage Vi=Ri IRef to its own sense latch, which consists of two cross coupled inverters identical to I0 feeding each other that are not shown.

As future technologies continue to scale downward in feature size, a potential drawback to the prior art approach is that random manufacturing process variations may cause each transistor mPi to have a unique threshold voltage, such that the sense current will differ from fuse to fuse (VRef is a low-overdrive analog signal). Another related concern is that gate leakage from the VRef signal through the gates of individual transistors mPi will limit how many fuses can share one large VrefGen circuit.

Differential sense schemes are known, and they are better able to handle the tail of the resistance value distribution, however, prior differential sensing techniques employ two fuses to achieve a single programmed value, and also require one large differential amplifier per programmed value, thereby increasing the overall area requirement for fuse programming and sensing operations.

Accordingly, a need exists for an eFuse capable of being programmed by a single low voltage pulse, which incorporates a sensing scheme less susceptible to noise and requires fewer circuit resources then conventional designs.

SUMMARY OF INVENTION

An aspect of the invention is an eFuse implementation that is programmable with a single low voltage pulse and which includes a differential sensing function capable of discriminating low levels of resistance. A preferred embodiment disclosed herein enables fuse programming at a voltage no higher than a burn-in voltage (e.g., 1.5V) for current semiconductor manufacturing processing technologies. As such, a dedicated 3.3V pin and thick-oxide transistors to switch a high voltage programming current are not required, thereby saving additional processing steps. With low-voltage programming, a distribution tail of low post-programming resistances is expected, however, the invention also incorporates a differential sense scheme that is able to sense low resistance values with very low circuit overhead. The differential amplifier is shared across a number of fuses; the voltage reference (for differential sensing) is shared across a large number of fuses; the individual fuse-programming transistors (required both for the low-voltage scheme claimed herein and in the prior art high-voltage implementations) are shared between the program and sense operations. In addition a large PMOS switch transistor is shared across a plurality of fuses.

DETAILED DESCRIPTION

Figure 1:
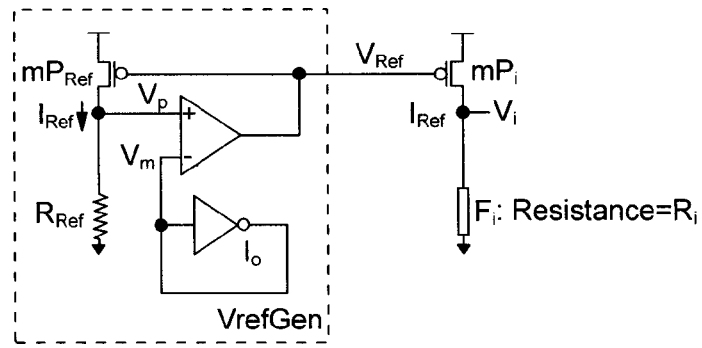
FIG. 1 illustrates a schematic of a prior art single-ended sensing scheme for eFuses.
Figure 2:
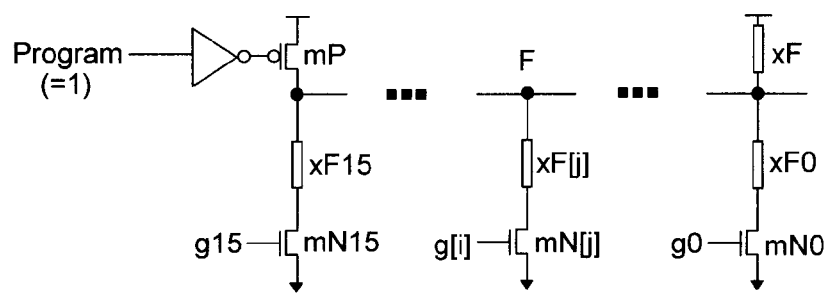
FIG. 2 shows a schematic diagram of the fuse programming circuitry according to a first embodiment of the invention.

FIG. 2 depicts the primary elements of the fuse-programming circuitry for a preferred embodiment of the present invention. A large PMOS mP pulls node F to Vdd, and a single decoded signal g[j] out of the group g[15:0] may be asserted for about 200 us to turn on pull-down transistor mN[j] and draw sufficient current through fuse xF[j] to change the resistance and program the fuse. Programming is accomplished by raising Vdd to about 1.5 times its normal value. However, each fuse requires only about 200 us to be programmed, so the total time for all fuses to be programmed is much less compared to the time the product is subjected to 1.5 times Vdd or greater during a device "burn-in" or other diagnostic tests, such as a dynamic voltage screen. During the programming operation, an extra fuse xF used during the sense operation is shorted out by transistor mP. Transistor mP serves the function of pulling node F all the way to Vdd to provide as much current as possible to program fuse xF[j], and also to prevent any voltage across fuse xF from altering it from its original unprogrammed state.

Figure 3:
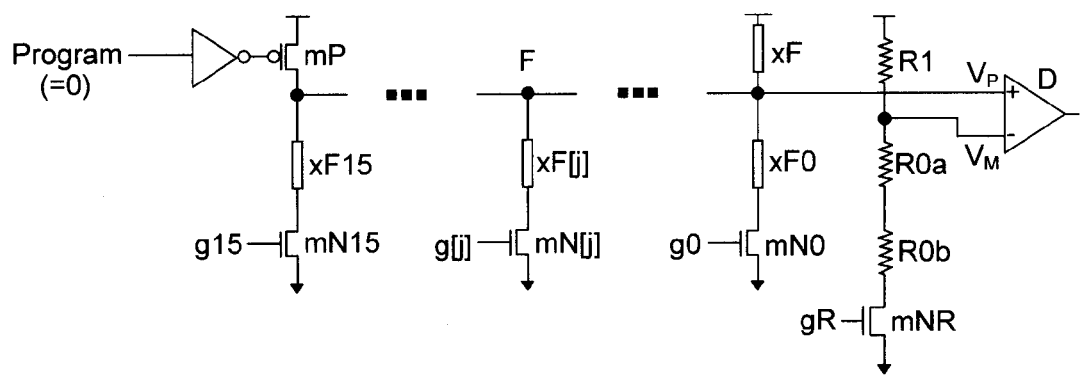
FIG. 3 illustrates a schematic diagram of the sense circuitry coupled to the fuse programming circuitry of FIG. 2.

FIG. 3 combines additional elements with the fuse programming circuit shown in FIG. 2 to implement the fuse sense circuitry according to a preferred embodiment of the present invention. Most notably, a differential amplifier is added to sense the voltage difference between the outputs of two voltage dividers. The first voltage divider whose output is node "F" consists of an intact reference fuse xF and of xF[j], the one fuse selected for sensing through decoded signal g[j]. The second voltage divider known as the reference voltage divider consists of resistors R1 and R0 and gating transistor mR. R0 is comprised of two components R0a and R0b which are identical to each other and identical to R1. Use of two resistors R0a and R0b to make up a single resistance R0 reduces the variation in the reference voltage divider output voltage through cancellation of edge effects common in VLSI resistors. A concern is that the DC current through the voltage divider may change the resistance of either xF or xF[j] as a result of the sense operation. However, this scheme has several features that dramatically reduce the resistance change due to the sense operation. First, the fuse sense operation is performed at normal Vdd, rather than 1.5 times Vdd, thereby reducing the current supplied for sensing. Second, the magnitude of the current is reduced another factor of two because xF and xF[j] are coupled in series, whereas during programming only xF[j] limits the programming current because mP supplies the elevated programming current. Next, the control voltage on g[j] during the sense operation is a short pulse of about 1 ns, as compared to about 200 us during fuse programming, which will limit the degree of variation in xF or xF[j] resistance. Lastly, in the case where xF[j] is already programmed, the post-program resistance will further reduce the current through xF.

The voltage at node F is equal to about 0.5*Vdd for an unprogrammed fuse and to about [b/(1+b)]*Vdd for a programmed fuse, where "b" is the post-fuse program to pre-fuse program resistance ratio. The distribution tail of a low-voltage post-program resistance value is expected to achieve b=10 (i.e., most post-fuse program resistances are expected to be more than about 1500Ω).

Node F is coupled to the positive input Vp of DiffAmp D while the negative input Vm is a reference voltage (0.67*Vdd) established with a circuit network of three identical resistors R1, R0a, R0b and gating transistor mNR. The gating transistor mNR emulates the voltage drop through the gating transistor mN[j] when an intact fuse is sensed. As such, transistor mNR is sized to have the same current density (hence voltage drop) of transistor mN[j]. Again, the control voltage on gate gR of transistor mNR during the sense operation is a short pulse of about 1 ns, which allows the duty cycle in the reference fuse chain to be low, as described in the discussion above regarding fuse xF and fuse xF[j].

The differential input voltage to DiffAmp D is 0.167*Vdd for an intact fuse and [(b−2)/3]*Vdd for a programmed fuse with post-programming resistance ratio "b." A post-programming resistance ratio as low as b=2.5 will produce as strong a signal response as the intact fuse.

Additionally, the DiffAmp output can be captured into a register with a strobe signal every time a rising edge occurs for the sense signal. The select signals are different for each successive sense signal until all fuses have been sampled, and their states stored in registers.

Referring to FIG. 3 again, the voltage at node Vp is determined by a voltage divider consisting of an unprogrammed fuse xF and a selected fuse xF[j] that can be either programmed or unprogrammed. Similarly, the voltage at node Vm is determined by a voltage divider consisting of resistors R1, R0a, and R0b.

In a second embodiment of the present invention, the fuse resistances are characterized both pre-fuse programming and post-fuse programming. The characterization feature is realized by using digital control bits with multiple settings to vary the voltages at node Vm, such that incremental changes in fuse resistances may be obtained.

Figure 4:
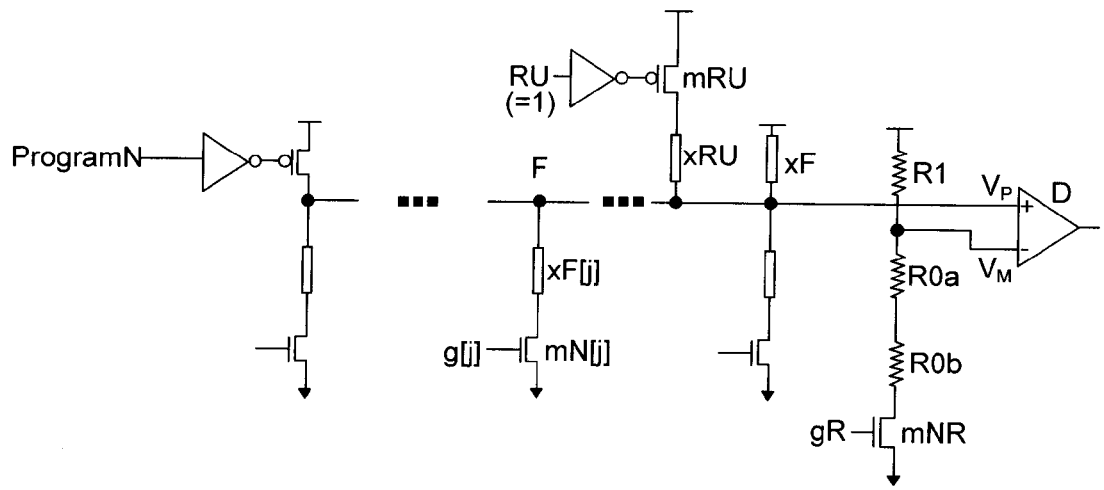
FIG. 4 shows a schematic diagram of the present invention according to a second embodiment.

As shown in FIG. 4, a digital control bit RU turns on transitor mRU, a large device with low resistance, such that fuse xF is now in parallel with a second unprogrammed fuse xRU. In this configuration, digital control bit RU causes an increase in the voltage at node Vp such that it is equal to the voltage on Vm if the selected fuse xF[j] is not programmed. This step by itself reduces the differential signal to zero in the case where xF[j] is unprogrammed, however, it also allows incremental adjustment of the voltage on node Vm to characterize resistance. Since the resistance of the series combination of R0a and R0b (collectively called "R0") is twice that of R1, the voltage on Vm is 0.67*Vdd. With RU=1, an ideal (i.e., no resistance anomalies) unprogrammed fuse also causes the voltage on Vp to be approximately 0.67*Vdd, so that the "threshold resistance" of fuse xF[j] approaches the ideal fuse resistance, RidealFuse.

Figure 5:
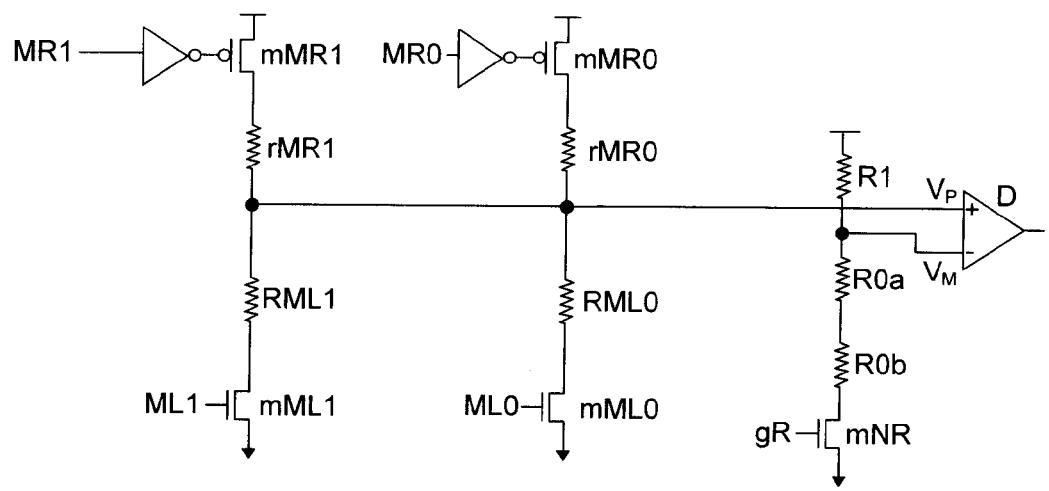
FIG. 5 illustrates a schematic diagram of an alternative circuit to generate a reference voltage at node Vm.

Referring to FIG. 5, a voltage reference circuit establishing the voltage on Vm, including new digital control bits ML[1:0] and MR[1:0] is shown. When all ML and MR bits are zero, the voltage on Vm is derived from the voltage divider comprising resistors R1, R0a and R0b and transistor mNR. However, when ML[1:0]=01, resistor RML0 is in parallel with R0, and Vm is reduced a small amount. The threshold of resistance on fuse xF[j] from FIG. 4 is now less than RidealFuse; when ML[0:1]=10 and 11, the voltage on Vm decreases further so that the threshold of resistance of xF[j] takes on smaller discrete values. All fuses could be sampled with different ML settings, and discrete points on the unprogrammed resistance distribution can be found for RFuse<RidealFuse.

Similarly, control bits MR[1:0] can be exercised to force Vm slightly higher (raising the threshold resistance above RidealFuse), so that discrete points of the unprogrammed resistance distribution can be found for RFuse>RidealFuse. In addition, if RU=0, the threshold returns to RFuse=2*RidealFuse in the absence of any non-zero value on ML or MR pins. The unprogrammed resistances will never approach 2*RidealFuse, but post-programming resistances will generally exceed this value, which allows the post-programming resistance distribution to be characterized. Leaving ML[1:0]=00 and counting through the non-zero value on MR[1:0], the voltage on node Vm is raised further, achieving higher threshold resistance and allowing the post-programming resistance distribution to be characterized at discreet points. Toggling both ML[1:0] and MR[1:0] allows even more granularity in the distribution to be characterized, although ML pins can not increase the maximum resistance threshold.

Figure 6:
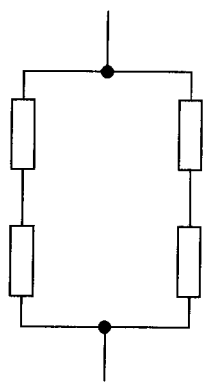
FIG. 6 shows a schematic diagram of a parallel combination of fuses.

To conserve area, the reference voltage network is shared with a plurality of differential amplifiers. Referring to FIG. 5, the increased complexity and size of the voltage reference circuit can be compensated for by sharing it across a larger number of DiffAmps to improve area efficiency. Because of unprogrammed fuse resistance variation, it is important to consider the reference pull up fuse xF shown in FIG. 3 and FIG. 4. Variation in this element introduces error into the sensing scheme described herein. Accordingly, fuse xF should be implemented as a combination of multiple fuses as shown in FIG. 6 to compensate for the potential variation in resistance values for individual fuses.

Figure 7A:
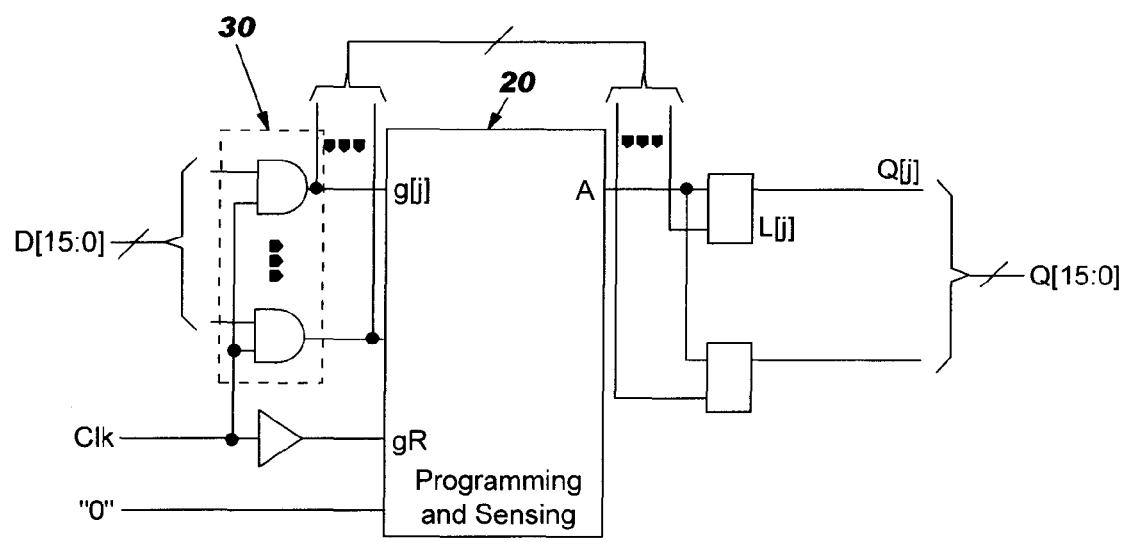
FIG. 7A depicts a schematic of an exemplar fuse select and decode logic circuit.
Figure 7B:
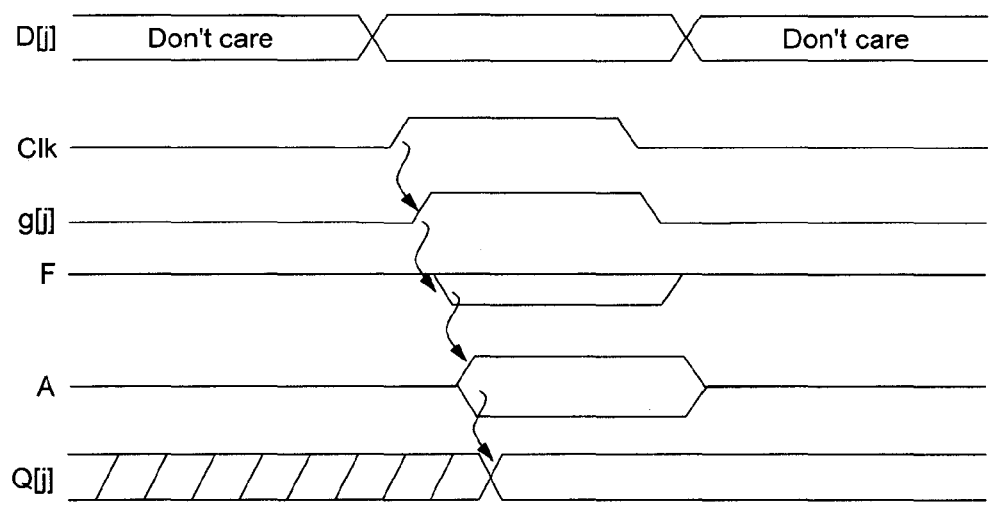
FIG. 7B show a timing diagram corresponding to the fuse select and decode operation.

FIGS. 7A and 7B show an exemplar schematic of the additional logic required for fuse selection and a timing diagram of the associated logic transitions, respectively. The fuse programming and sensing element 20 is a block diagram representation of the fuse programming and sensing circuitry depicted in FIG. 3. Referring to FIG. 7A, one of the pins D[15:0] is brought high to select which fuse will be read. Then clock signal, Clk is brought high to initiate the read operation. One of the AND2 gates 30 which receives both Clk and a D[j] signal that is a "1" will provide a "1" output on its g[j] output. This will turn on transistor mN[j] shown in FIG. 3 so that node F in FIG. 3 is pulled down if the fuse is intact, or node F will remain high if the fuse is programmed. The clock signal also turns on transistor mNR depicted in the voltage divider of FIG. 3. The DiffAmp output A (shown in FIG. 7A) will go to a "0" if the fuse is intact, or a "1" if the fuse is programmed. This output A is provided to the D input of each of the latches L[15:0]. However, each latch gets a unique clock g[j], and only one of these g[j] signals is active to allow just one latch L[j] to be updated with the value on its D input. Thus only one of the outputs Q[15:0] will change during a read operation.

While the invention has been described in detail, the foregoing description is in all aspects illustrative and not restrictive. It is understood that numerous other modifications and variations can be devised without departing from the scope of the invention.

What is claimed is:

1. An integrated circuit adapted for low voltage programming and differential sensing of an electronic fuse, the circuit comprising:
    an electronic fuse having a first terminal and a second terminal;
    a first transistor coupled to the first terminal, the first transistor configured to switch a programming voltage to the first terminal;
    a second transistor coupled to the second terminal of the electronic fuse, the second transistor active during both a programming operation and a sensing operation;
    a first dummy fuse coupled to the first terminal and coupled to a supply voltage, the dummy fuse configured to reduce a sensing current through the electronic fuse;
    a differential amplifier having a first input terminal coupled to the first terminal of the electronic fuse and a second input terminal coupled to a first voltage divider providing a reference voltage for the sensing operation; and
    a gating transistor coupled to the voltage divider, the gating transistor configured to be active during the sensing operation.

2. The integrated circuit according to claim 1, wherein the programming voltage is greater than a supply voltage for the integrated circuit.

3. The integrated circuit according to claim 1, wherein the first voltage divider is comprised of a plurality of resistive elements.

4. The integrated circuit according to claim 1, wherein the dummy fuse is a resistor element.

5. The integrated circuit according to claim 1, further comprising:
    an inverter providing a programming signal to the first transistor.

6. The integrated circuit according to claim 1, wherein the voltage drop across the gating transistor is substantially equal to the voltage drop across the second transistor during the sensing operation when the electronic fuse is in an unprogrammed state.

7. The integrated circuit according to claim 1, wherein a control voltage is applied to the second transistor for a period of time to perform the sensing operation, such that a variation in resistance across the electronic fuse caused by the sensing operation is limited.

8. The integrated circuit according to claim 2, wherein the programming voltage is about 1.5 times the supply voltage for the integrated circuit.

9. The integrated circuit according to claim 1, further comprising an array of electronic fuses, wherein the differential amplifier and reference voltage are coupled to the array of electronic fuses and a gating transistor is provided for each of the electronic fuses in the array.

10. The integrated circuit according to claim 9 further comprising:
 a fuse selection and decode circuit having the capability to select a single fuse for programming and sensing from among the array of electronic fuses; and
 plurality of integrated circuit latches corresponding to each electronic fuse in the array, each one of the plurality of latches configured to store a digital value corresponding to a programming state of an electronic fuse in the array.

11. The integrated circuit according to claim 10 further comprising:
 a second dummy fuse coupled to the first input, of the differential amplifier, the second dummy fuse configured to enable incremental adjustment of the reference voltage;
 a fourth transistor coupled to the second dummy ruse;
 a first digital control input coupled to a gate of the fourth transistor to switch the the supply voltage to the second dummy fuse; and
 an inverter having an output coupled to the gate of the fourth transistor.

12. The integrated circuit according to claim 11 further comprising:
 a second voltage divider coupled to the second input of the differential amplifier, the second voltage divider configured to enable incremental adjustment of the reference voltage; and
 a fifth transistor coupled to the second voltage divider and coupled to the supply voltage, the fifth transistor being driven by a second digital control input.

13. The integrated circuit according to claim 12 further comprising:
 a sixth transistor coupled to the second voltage divider and coupled to a ground potential, the sixth transistor being driven by a third digital control input.

14. The integrated circuit according to claim 13, further comprising:
 a plurality of digital control inputs configured to enable incremental adjustment of the reference voltage, each one of the plurality of digital control inputs driving a transistor to switch one of a plurality of current paths; and
 a complex voltage divider coupled to the second input of the differential amplifier, the complex voltage divider capable of switching a plurality of current paths corresponding to one of the plurality of digital control inputs.

15. An integrated circuit adapted for low voltage programming and differential sensing of an electronic fuse, the circuit comprising:
 an inverter providing a programming signal;
 a first transistor having a gate coupled to the output of the inverter, a source coupled to a power supply for the integrated circuit and a drain coupled to the first terminal, the first transistor configured to switch a programming voltage to the first terminal;
 a second transistor having a gate coupled to a decoded fuse select signal, a source coupled to a ground potential and a drain coupled to the second terminal, the second transistor being active during both a programming operation and a sensing operation;
 a differential amplifier having a first input terminal coupled to the first terminal of the electronic fuse and a second input terminal coupled to a first voltage divider providing a reference voltage for the sensing operation, the differential amplifier configured to generate a digital output signal corresponding to a programming state of the electronic fuse;
 a first dummy fuse coupled to the first terminal and coupled to the supply voltage, the dummy fuse configured to reduce a sensing current through the electronic fuse; and
 a gating transistor coupled to the voltage divider, the gating transistor configured to be active daring the sensing operation.

16. A method of programing and sensing the state a voltage programmable electronic fuse (eFuse) in an integrated circuit, the method comprising:
 selecting an electronic fuse for programming;
 programming the electronic fuse;
 providing a reference voltage for a sensing operation; and
 comparing a voltage drop across the selected fuse for programming to the reference voltage during the sensing operation.

17. The method according to claim 16, further comprising:
 performing the comparing step with a differential amplifier; and
 storing the output of the differential amplifier in a latch.

18. The method according to claim 16, further comprising:
 providing a plurality of digital control inputs:
 modifying the reference voltage in discrete increments with the plurality of digital control inputs;
 comparing the voltage drop across each of a plurality of electronic fuses with the modified reference voltage, wherein each of the plurality of electronic fuses is sensed independently; and
 characterizing the resistance of each of the plurality of electronic fuses based on the results of the comparing step.

19. A program storage device readable by a machine, tangibly embodying a program of instructions executable by the machine to perform method steps for programming and sensing an electronic fuse, said method steps comprising;
 selecting an electronic fuse for programming;
 programming the electronic fuse;
 providing a reference voltage for the sense operation; and
 comparing a voltage drop across the selected fuse for programming to a reference voltage during a sensing operation.

20. The program storage device of claim 19, further comprising:
 providing a plurality of digital control inputs;
 modifying the reference voltage in discrete increments with the digital control inputs;
 comparing the voltage drop across each of the plurality of electronic fuses with the modified reference voltage; and
 characterizing the resistance of each of the plurality of electronic Fuses based on the results of the comparing step.

* * * * *